(12) United States Patent
Xue et al.

(10) Patent No.: US 12,142,548 B2
(45) Date of Patent: Nov. 12, 2024

(54) SEMICONDUCTOR PACKAGE HAVING MOLD LOCKING FEATURE

(71) Applicant: ALPHA AND OMEGA SEMICONDUCTOR INTERNATIONAL LP, Toronto (CA)

(72) Inventors: Yan Xun Xue, Los Gatos, CA (US); Long-Ching Wang, Cupertino, CA (US); Xiaoguang Zeng, Shanghai (CN); Mary Jane R. Alin, Shanghai (CN); Hailin Zhou, Shanghai (CN); Guobing Shen, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 222 days.

(21) Appl. No.: 17/566,294

(22) Filed: Dec. 30, 2021

(65) Prior Publication Data

US 2023/0215783 A1 Jul. 6, 2023

(51) Int. Cl.
*H01L 23/495* (2006.01)
*H01L 23/00* (2006.01)
*H01L 23/31* (2006.01)

(52) U.S. Cl.
CPC .... *H01L 23/49503* (2013.01); *H01L 23/3107* (2013.01); *H01L 23/49541* (2013.01); *H01L 24/40* (2013.01); *H01L 2224/40175* (2013.01)

(58) Field of Classification Search
CPC ............. H01L 23/3107; H01L 24/40; H01L 23/49524; H01L 23/49541; H01L 2224/40175

USPC ......................................................... 257/676
See application file for complete search history.

(56) References Cited

U.S. PATENT DOCUMENTS

| | | | |
|---|---|---|---|
| 5,557,150 A | 9/1996 | Variot et al. | |
| 7,525,179 B2 | 4/2009 | Joshi et al. | |
| 8,519,518 B2 | 8/2013 | Do et al. | |
| 8,703,540 B2 | 4/2014 | Niu et al. | |
| 2011/0079885 A1* | 4/2011 | Camacho | H01L 23/49541 257/676 |

(Continued)

FOREIGN PATENT DOCUMENTS

| CN | 102714201 B | * | 9/2015 |
|---|---|---|---|
| CN | 110890336 A | | 3/2020 |
| CN | 214505485 U | | 10/2021 |

*Primary Examiner* — Kimberly N Rizkallah
*Assistant Examiner* — Dilinh P Nguyen
(74) *Attorney, Agent, or Firm* — Chen-Chi Lin (57) ABSTRACT

A semiconductor package comprises a lead frame, a chip, and a molding encapsulation. The lead frame comprises one or more die paddles comprising a first die paddle. The first die paddle comprises one or more through holes, one or more protrusions with grooves on top surfaces of the one or more protrusions, or one or more squeezed extensions. Each of the one or more through holes is filled with a respective portion of the molding encapsulation. Each of the one or more through holes may be of a rectangular shape, a rectangular shape with four filleted corners, a circular shape, or an oval shape. Each of the grooves is filled with a respective portion of the molding encapsulation. A respective side wall of each of the one or more squeezed extensions is of a swallowtail shape. The swallowtail shape directly contacts the molding encapsulation.

12 Claims, 8 Drawing Sheets

(56) References Cited

U.S. PATENT DOCUMENTS

2015/0179626 A1\* 6/2015 Zhang ................ H01L 24/49
    438/17

\* cited by examiner

SEMICONDUCTOR PACKAGE HAVING MOLD LOCKING FEATURE

FIELD OF THE INVENTION

This invention relates generally to a semiconductor package having mold locking feature. More particularly, the present invention relates to a semiconductor package having a die paddle with a through hole filled with molding encapsulation.

BACKGROUND OF THE INVENTION

Transistor outline leaded with gullwing (TOL-G) packages are frequently used in power device application. Due to shear stresses introduced by the mismatch of thermal expansion amounts, during temperature cycles, between the printed circuit board and the semiconductor package, the reliability performance has been challenging.

The present disclosure provides a solution by introducing mold locking feature so that the reliability performance has been improved. For example, the present disclosure may be applied to gullwing lead package (GL-PAG) application. The tradeoff of the additional package surface area used by the mold locking feature is offset by the reduction of the exposed die paddle areas used for clamping during manufacturing processes.

SUMMARY OF THE INVENTION

The present invention discloses a semiconductor package comprising a lead frame, a chip, and a molding encapsulation. The lead frame comprises one or more die paddles comprising a first die paddle. The first die paddle comprises one or more through holes. Each of the one or more through holes is filled with a respective portion of the molding encapsulation. Each of the one or more through holes may be of a rectangular shape, a rectangular shape with four filleted corners, a circular shape, or an oval shape.

The first die paddle further comprises one or more protrusions with grooves on top surfaces of the one or more protrusions. Each of the grooves is filled with a respective portion of the molding encapsulation. The first die paddle still further comprises one or more squeezed extensions. A respective side wall of each of the one or more squeezed extensions is of a swallowtail shape. The swallowtail shape directly contacts the molding encapsulation.

DETAILED DESCRIPTION OF THE INVENTION

Figure 1A:
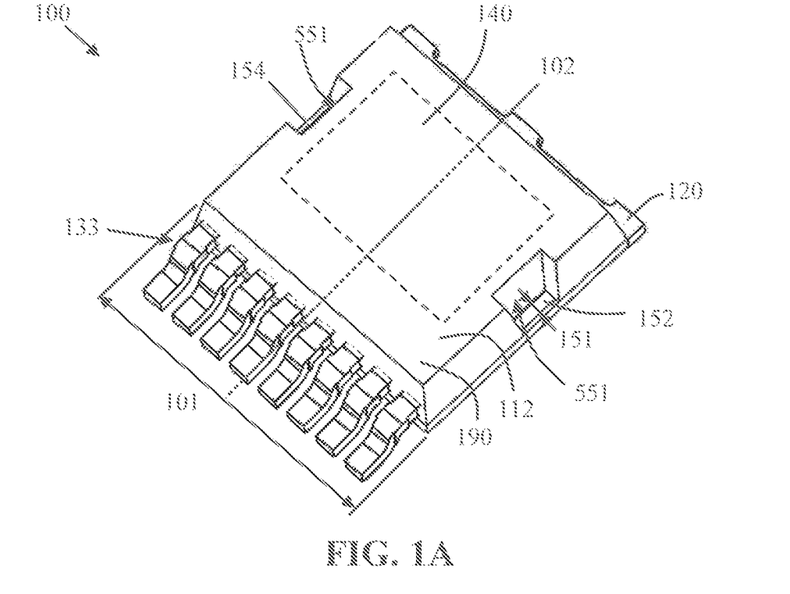
FIGS. 1A and 1B show a front-perspective view and a back-perspective view of a semiconductor package in examples of the present disclosure.
Figure 1B:
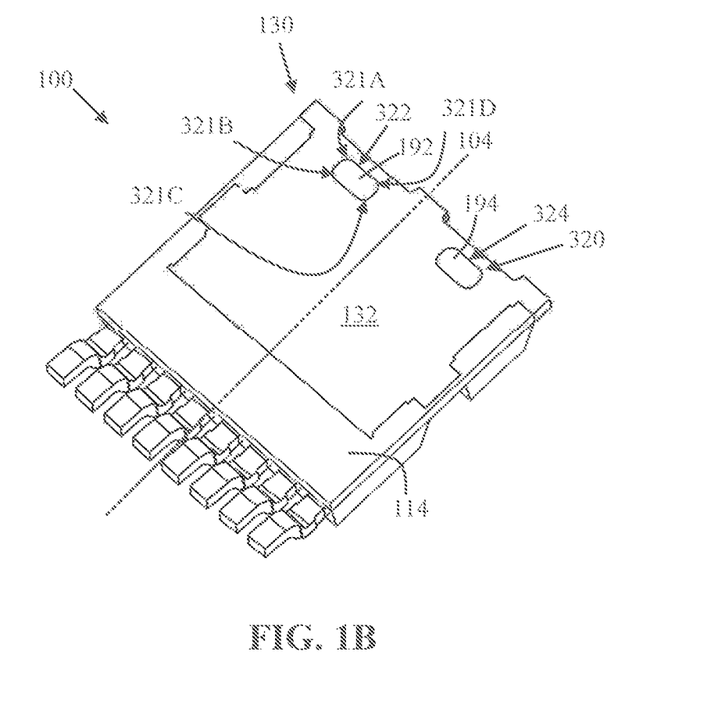

FIGS. 1A and 1B show a front-perspective view and a back-perspective view of a semiconductor package 100 in examples of the present disclosure. The semiconductor package 100 comprises a lead frame 120, a chip 140, and a molding encapsulation 190. The chip 140 is shown in dashed lines because the molding encapsulation 190 encloses the chip 140. The lead frame 120 comprises one or more die paddles 130 comprising a first die paddle 132. The lead frame 120 further comprises one or more leads 133 disposed along and separate from a first side of the first die paddle 132. The first die paddle 132 comprises one or more through holes 320 comprising a first through hole 322 and a second through hole 324 aligned in parallel and approximate to a second side of the die paddle 132 opposite the first side. The chip 140 is mounted on the one or more die paddles 130. An entirety of the first through hole 322 is filled with a first portion 192 of the molding encapsulation 190. An entirety of the second through hole 324 is filled with a second portion 194 of the molding encapsulation 190. In examples of the present disclosure, the first through hole 322 and the second through hole 324 are symmetric with respect to a centerline 104 of a bottom surface 114 of the semiconductor package 100.

In one example, a bottom of the first through hole 322 is of a rectangular shape. In another example, a bottom of the first through hole 322 is of a rectangular shape with four filleted corners 321A, 321B, 321C, and 321D. In still another example, a bottom of the first through hole 322 is of a circular shape. In yet another example, a bottom of the first through hole 322 is of an oval shape.

In one example, a bottom of the second through hole 324 is of a rectangular shape. In another example, a bottom of the second through hole 324 is of a rectangular shape with four filleted corners. In still another example, a bottom of the second through hole 324 is of a circular shape. In yet another example, a bottom of the second through hole 324 is of an oval shape.

In examples of the present disclosure, the semiconductor package 100 further comprises a first exposed die paddle portion 152 on a third side of the die paddle 132 orthogonal to the first and second sides and a second exposed die paddle portion 154 on a fourth side of the die paddle opposite the third side. The first exposed die paddle portion 152 and the second exposed die paddle portion 154 are symmetric with respect to a centerline 102 of a top surface 112 of the semiconductor package 100.

In examples of the present disclosure, the first exposed die paddle portion 152 and the second exposed die paddle portion 154 extend beyond corresponding side edges of the die paddle 132 and are used for application of clamping tools during a manufacturing process. The clamping tools for a wire bonding process require larger sizes of the first exposed die paddle portion 152 and the second exposed die paddle portion 154 than that of a molding process (because the molding chamber is heavier and more stable than the wire bonding equipment). In one example, the one or more clips 720 of FIG. 7B are used to replace bonding wires. Unlike wire bonding process in which large clamping area is required to prevent vibration caused by the impact of wire bonding, clip attachment process uses soldering process without much external force therefore can use much smaller clamping area. The use of clips thereby enables reduction of the size of the first exposed die paddle portion 152 and the second exposed die paddle portion 154. In examples of the present disclosure, a width 151 of each of the first exposed die paddle portion 152 and the second exposed die paddle portion 154 is in a range from 7% to 15% of a width 101 of the top surface 112 of the semiconductor package 100.

Figure 2:
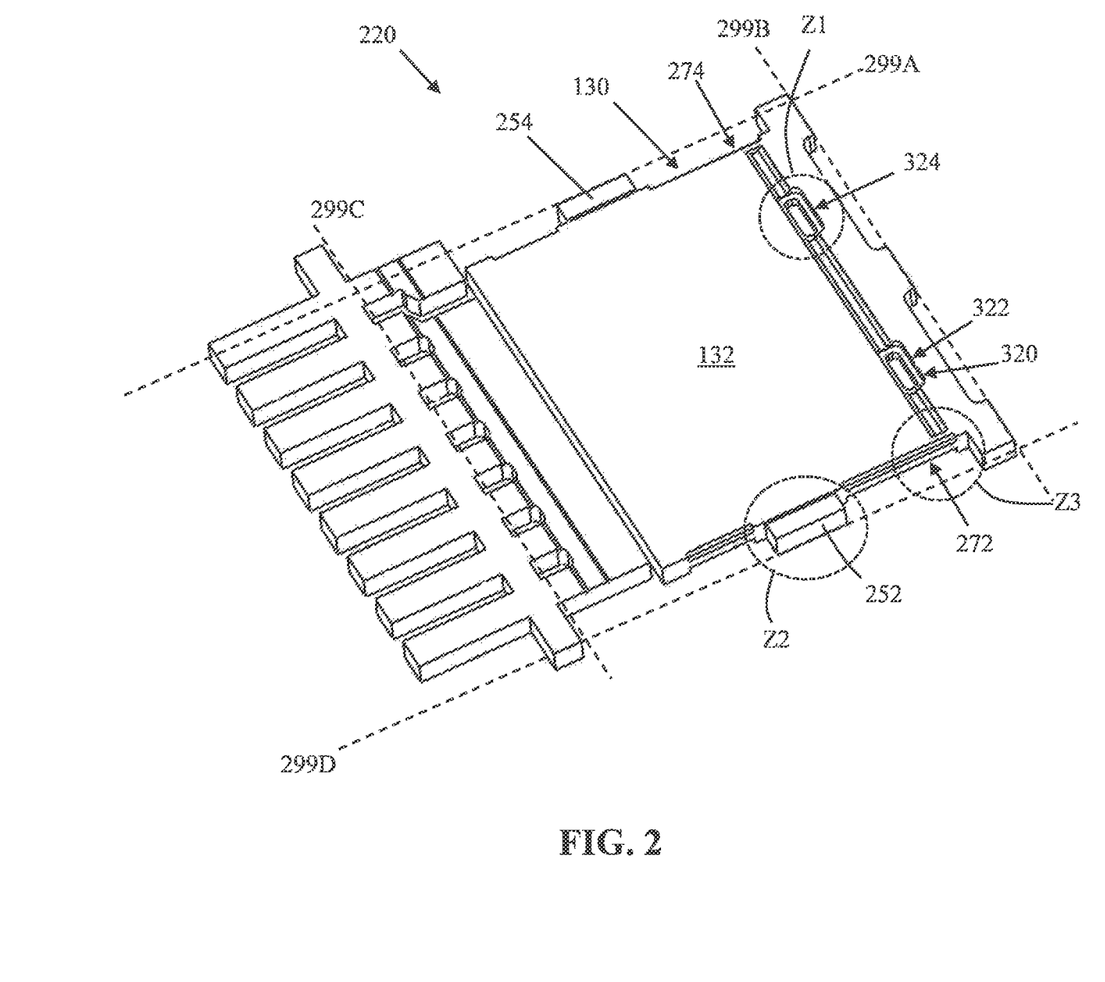
FIG. 2 shows a perspective view of a lead frame in examples of the present disclosure.

FIG. 2 shows a perspective view of a lead frame 220 in examples of the present disclosure. In one example, after cutting through the singulation lines 299A, 299B, 299C, and 299D, the lead frame 220 becomes the lead frame 120 of FIG. 1A. The lead frame 220 comprises one or more die paddles 130 comprising a first die paddle 132. The first die paddle 132 comprises a first through hole 322, a second through hole 324, a first protrusion 252, a second protrusion 254, a first squeezed extension 272, and a second squeezed extension 274. The first protrusion 252 and the second protrusion 254 extend beyond corresponding side edges of the die paddle 132.

In one example, the lead frame 220 is made of a conductive metal. In another example, the lead frame 220 is a pre-plated frame (PPF) array.

Figure 3:
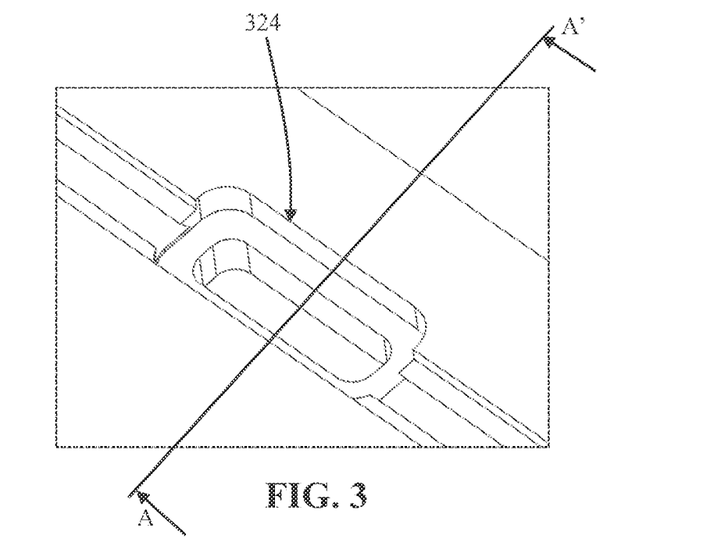
FIG. 3 shows a perspective view of a through hole in examples of the present disclosure.
Figure 4:
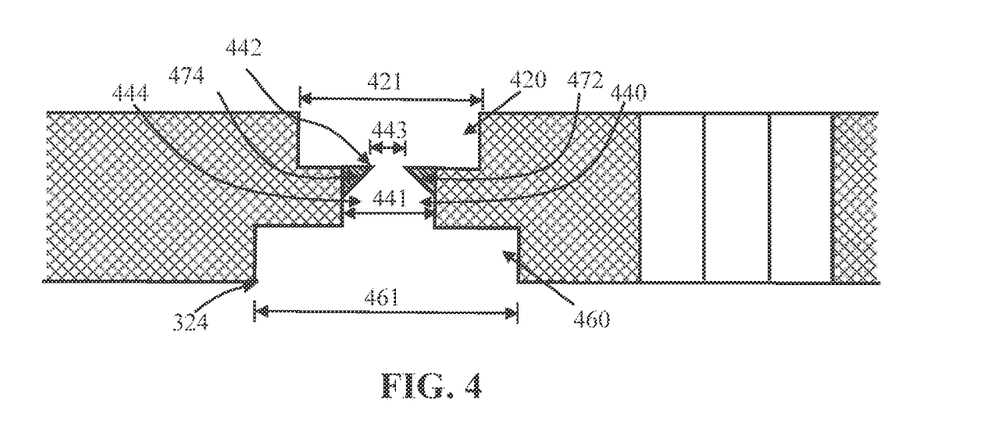
FIG. 4 shows a cross-sectional view of a through hole in examples of the present disclosure.

FIG. 3 shows a zoomed-in, perspective view of a through hole 324 of FIG. 2 around circle Z1 in examples of the present disclosure. FIG. 4 shows a cross-sectional view along AA' of FIG. 3 of a through hole 324 in examples of the present disclosure. In one example, the shape and the dimension of the first through hole 322 is the same as those of the second through hole 324.

In examples of the present disclosure, the through hole 324 comprises an upper section 420, a middle section 440, and a lower section 460. A width 421 of the upper section 420 is smaller than a width 461 of the lower section 460. A largest width 441 of the middle section 440 is smaller than the width 421 of the upper section 420.

In examples of the present disclosure, the middle section 440 comprises a tapered sub-section 442 and a straight sub-section 444 below the tapered sub-section 442. A width 441 of the straight sub-section 444 is the largest width 441 of the middle section 440. A width 443 of a top of the tapered sub-section 442 is smaller than a width 441 of the straight sub-section 444.

In one example, the through hole 324 is made by a first punching process at a bottom surface forming the lower section 460; followed by a cutting or a drilling process forming the straight sub-section 444; then followed by a second punching process at a top surface forming the upper section 420 and the tapered sub-section 442. The squeezed materials 472 and 474 are the results of the second punching process.

In another example, the through hole is made by a cutting or a drilling process; followed by a first punching process at a bottom surface; then followed by a second punching process at a top surface. There are two sets of squeezed materials 472 and 474. The first is formed at the interface of the upper section 420 and the middle section 440. The second set is formed at the interface of the middle section 440 and the lower section 460.

Figure 5:
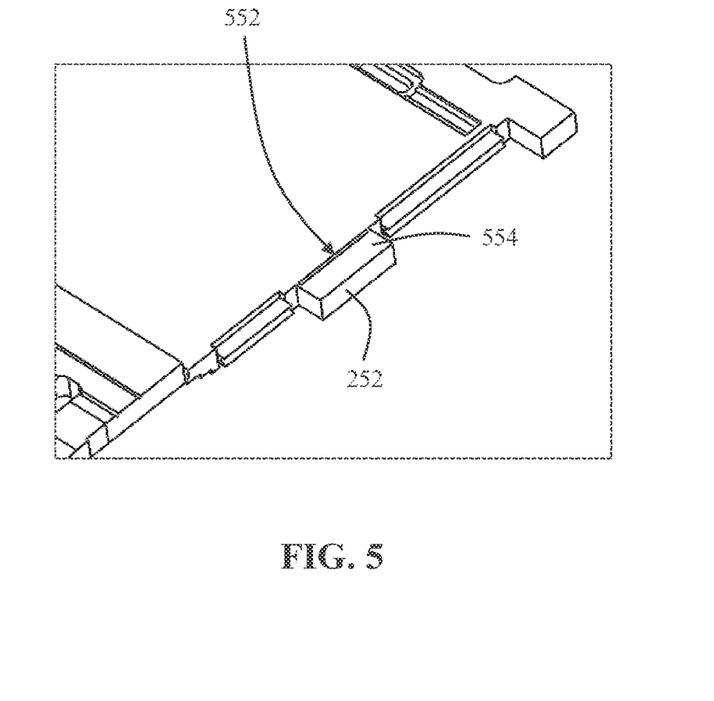
FIG. 5 shows a perspective view of a protrusion in examples of the present disclosure.
Figure 9:
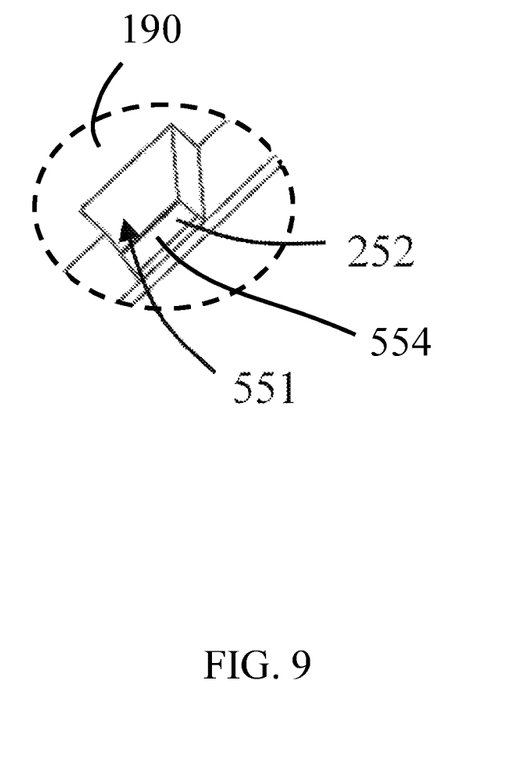
FIG. 9 show a front-perspective view of a protrusion and a portion of a molding encapsulation of a semiconductor package in examples of the present disclosure.

FIG. 5 shows a zoomed-in, perspective view of a first protrusion 252 of FIG. 2 around circle Z2 in examples of the present disclosure. FIG. 9 is similar to the portion near the recess sidewall portion 551 of FIG. 1A. The first protrusion 252 comprises a first groove 552 substantially aligned to a corresponding side edge of the die paddle 132. The first groove 552 separates a top surface 554 of the first protrusion 252 from a top surface of the die paddle 132. Referring now to FIG. 5 and FIG. 9, an entirety of the first groove 552 is filled with a portion of the molding encapsulation 190 as shown in FIG. 1A and FIG. 9, where the molding encapsulation 190 has a recess sidewall portion 551 above the top surface 554 of the first protrusion 252. The second protrusion 254 comprises a second groove separating a top surface of the second protrusion from the top surface of the die paddle 132. In examples of the present disclosure, the first protrusion 252 and the second protrusion 254 are symmetric with respect to a centerline 104 of a bottom surface 114 of the semiconductor package 100.

In one example, a cross section of each of the first groove 552 and a second groove on a top surface of the second protrusion 254 is of a letter V shape. In another example, a cross section of each of the first groove 552 and the second groove is of a circular arc shape.

A portion of top surface 554 of the first protrusion 252 is exposed from the molding encapsulation 190 by the recess sidewall portion 551 above the top surface 554 of the first protrusion 252, forming the first exposed die paddle portion 152 of FIG. 1A. A portion of top surface of the second protrusion 254 is exposed from the molding encapsulation 190 by the recess sidewall portion 551 above the top surface 554 of the second protrusion 254, forming the second exposed die paddle portion 154 of FIG. 1A.

Figure 6:
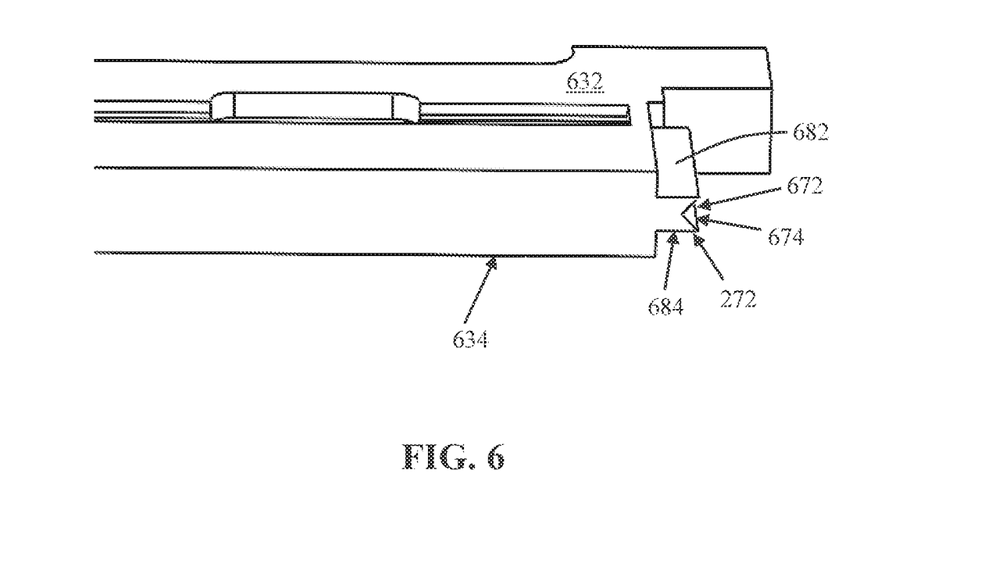
FIG. 6 shows a perspective view of a squeezed extension in examples of the present disclosure.

FIG. 6 shows a zoomed-in, perspective view of a first squeezed extension 272 of FIG. 2 around circle Z3 in examples of the present disclosure. The first squeezed extension 272 comprises an upper tapered side wall 672 and a lower tapered side wall 674. The side wall comprising the upper tapered side wall 672 and the lower tapered side wall 674 is of a swallowtail shape. A top surface 682 of the first squeezed extension 272 is positioned below and substantially parallel to a top surface 632 of the first die paddle 132. A bottom surface 684 of the first squeezed extension 272 is positioned above and substantially parallel to a bottom surface 634 of the first die paddle 132. The upper tapered side wall 672 directly contacts the molding encapsulation 190. The lower tapered side wall 674 directly contacts the molding encapsulation 190.

The first squeezed extension 272 is formed on an edge sidewall of the third side of die paddle 132 and the second squeezed extension 274 is formed on an edge sidewall of the fourth side of die paddle 132. Each of the first squeezed extension 272 and second squeezed extension 274 may further comprise a first section and a second section separated by the first protrusion 252 and the second protrusion 254 respectively. Each of the first section is adjacent to the first side of the die paddle 132 and each of the second section is adjacent to the second side of the die paddle 132. Each of the first section has a length shorter than the second section. In examples of the present disclosure, the second squeezed extension 274 has the same size and the same shape as the first squeezed extension 272. The first squeezed extension 272 and the second squeezed extension 274 are symmetric with respect to a centerline 104 of a bottom surface 114 of the semiconductor package 100.

Each section of the first squeezed extension 272 and the second squeezed extension 274 may be formed by a cutting step; followed by a first punching step on a respective bottom surface; and then followed by a second punching step on a respective top surface.

Figure 7A:
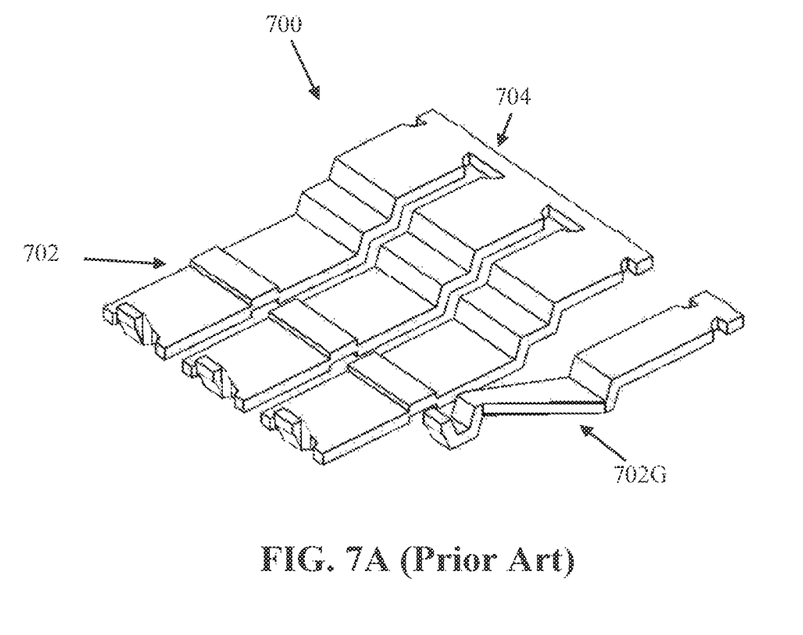
FIG. 7A shows a perspective view of a portion of a conventional clip frame and FIG. 7B shows a perspective view of a portion of a clip frame in examples of the present disclosure.
Figure 7B:
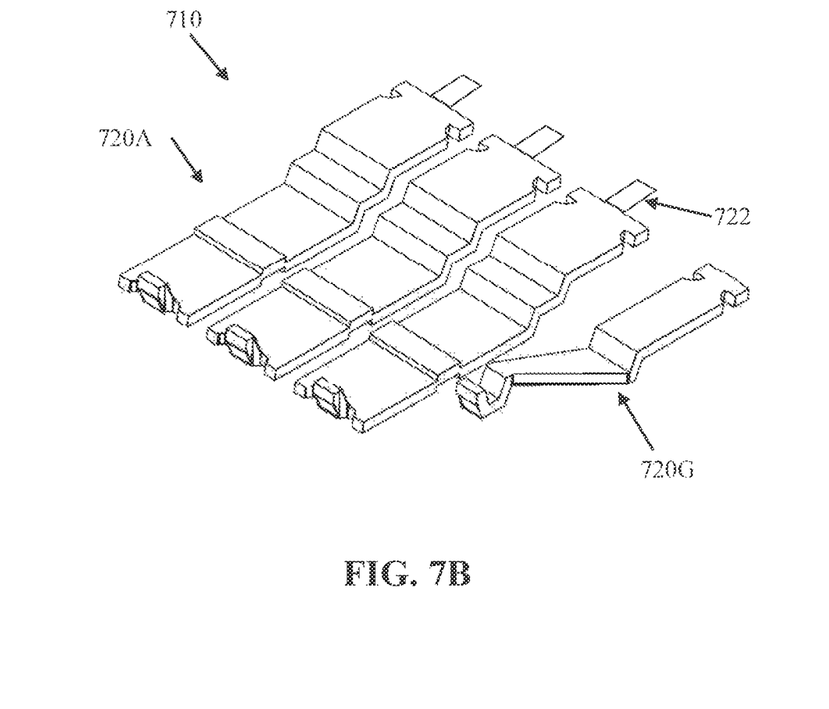

FIG. 7A shows a perspective view of a portion of a conventional clip frame 700. The conventional clip frame 700 comprises one or more clips 702 and one or more bars 704. The one or more clips 702 are interconnected by the one or more bars 704 at least at one end. The conventional clip frame 700 may further comprise a gate clip 702G separate from the one or more clips 702. In packaging process to apply conventional clip frame 700 to the package 100 of FIG. 1A, the one or more clip 702 are connected to an electrode disposed on a top surface of the chip 140 and the one or more bars 704 are connected to a lead of the lead frame. FIG. 7B shows a perspective view of a portion of a scalable clip frame 710 in examples of the present disclosure. The scalable clip frame 710 comprises two or more clips 720 and one or more links 722. The one or more links 722 connect each of the two or more clips 720 to another portion of the scalable clip frame 710. The scalable clip frame 710 may further comprise a gate clip 720G separate from the two or more clips 720. In packaging process, the two or more clips 720 are cut off from the scalable clip frame 710 by cutting off the one or more links 722. Each of the two or more clips 720 are completely separate from each other.

Figure 8A:
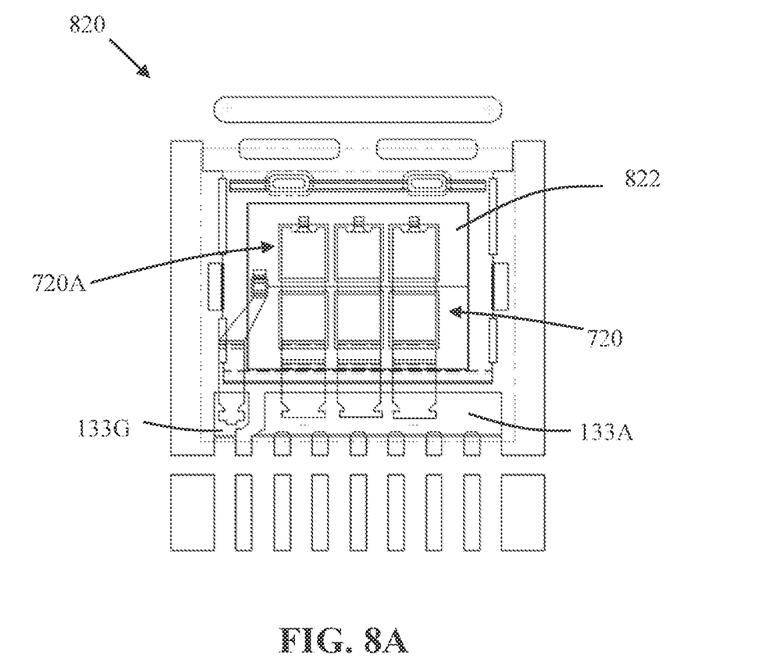
FIGS. 8A, 8B, and 8C show a top view of semiconductor packages having different sizes of chips respectively in examples of the present disclosure.

FIG. 8A shows a top view of semiconductor packages 820 where the scalable clip frame 710 in examples of the present disclosure is implemented in the semiconductor package 100 of FIG. 1A. The semiconductor packages 820 further comprises two or more clips 720. The one or more leads 133 of the lead frame 120 of FIG. 1A comprises a first lead 133A. The two or more clips 720 separately connect an electrode on a top surface of the chip 822 to the first lead 133A, each clip of the two or more clips 720 has an individual connection to the first lead 133A. The one or more leads 133 of the lead frame 120 of FIG. 1A may further comprise a second lead (a gate lead) 133G separate from the first lead 133A. The gate clip 720G may connect a gate electrode on the top surface of the chip 822 to the gate lead 133G.

In examples of the present disclosure, the two or more clips 720 are separated from the scalable clip frames 710.

Figure 8B:
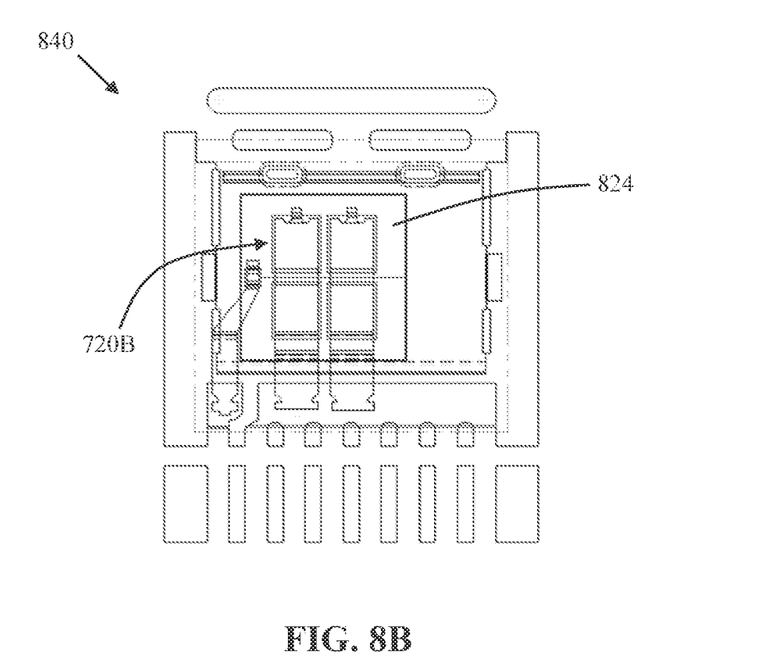
Figure 8C:
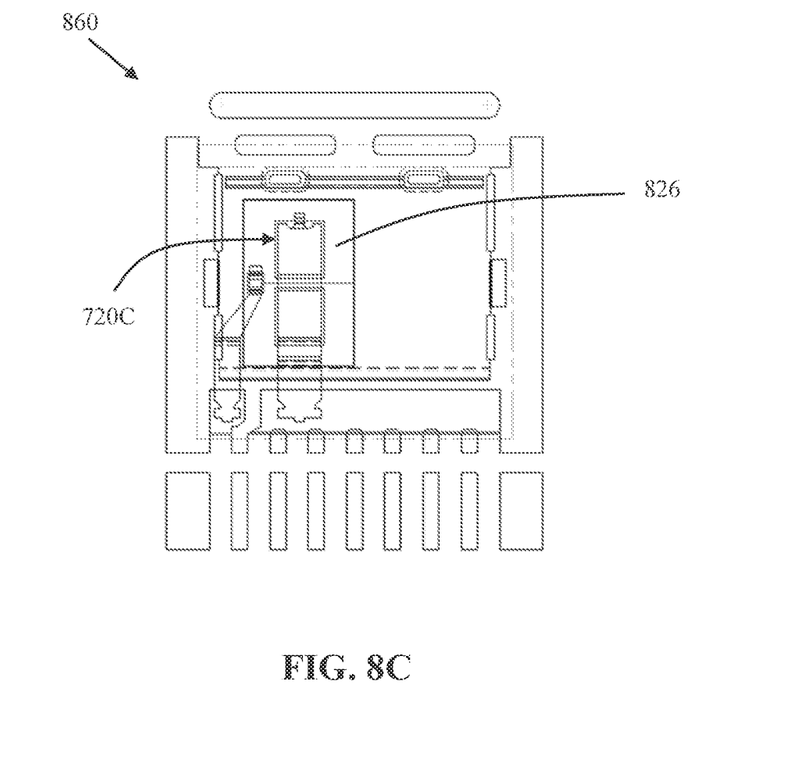

FIGS. 8A, 8B, and 8C show a top view of semiconductor packages 820, 840, and 860 having different sizes of chips 822, 824, and 826 respectively in examples of the present disclosure. A size of chip 822 is larger than a size of chip 824. A size of chip 824 is larger than a size of chip 822. The semiconductor packages 820 comprises three separate clips 720A of the one or more clips 720 of the scalable clip frame 710 of FIG. 7B by cutting off the one or more links 722 connecting the three clips 720A to another portion of the scalable clip frame 710. The semiconductor packages 840 comprises two separate clips 720B of the one or more clips 720 of the scalable clip frame 710 of FIG. 7B by cutting off the one or more links 722 connecting the two clips 720B to another portion of the scalable clip frame 710. The semiconductor packages 860 comprises one clip 720C of the one or more clips 720 of the scalable clip frame 710 of FIG. 7B by cutting off the one or more links 722 connecting the one clip 720C to another portion of the scalable clip frame 710. Because the different sized semiconductor packages 820, 840, and 860 all use the same design of the scalable clip frame 710 of FIG. 7B, the scalable clip frame 710 of FIG. 7B is "scalable".

Those of ordinary skill in the art may recognize that modifications of the embodiments disclosed herein are possible. For example, a number of through holes 320 may vary. The shapes of the through holes 320 may vary. Other modifications may occur to those of ordinary skill in this art, and all such modifications are deemed to fall within the purview of the present invention, as defined by the claims.

The invention claimed is:
1. A semiconductor package comprising:
 a lead frame comprising
  a first die paddle; and
  one or more leads disposed along a first side of the first die paddle;
 a chip mounted on the first die paddle; and
 a molding encapsulation enclosing the chip;
 wherein the first die paddle comprises:
  one or more through holes aligned in parallel and approximate to a second side of the first die paddle opposite the first side of the first die paddle;
  a first protrusion extending beyond an edge of the first die paddle at a third side orthogonal to the first and second sides;
  a second protrusion extending beyond an edge of the first die paddle at a fourth side opposite to the third side;
 wherein an entirety of the one or more through holes is filled with a first portion of the molding encapsulation
 wherein the first protrusion comprises:
  a first groove substantially aligned to the edge of the first die paddle at the third side separating a top surface of the first protrusion from a top surface of the first die paddle;
 wherein an entirety of the first groove is filled with a second portion of the molding encapsulation;
 wherein the second protrusion comprises:
  a second groove substantially aligned to the edge of the first die paddle at the fourth side separating a top surface of the second protrusion from the top surface of the first die paddle;
 wherein the first protrusion and the second protrusion are symmetric with respect to a centerline of a bottom surface of the semiconductor package;
 wherein a portion of the top surface of the first protrusion is exposed from the molding encapsulation; and
 wherein a portion of the top surface of the second protrusion is exposed from the molding encapsulation.
2. The semiconductor package of claim 1, wherein each of the one or more through holes comprises
 an upper section;
 a middle section; and
 a lower section;
 wherein a width of the upper section is smaller than a width of the lower section; and
 wherein a largest width of the middle section is smaller than the width of the upper section.
3. The semiconductor package of claim 2, wherein a bottom of each of the one or more through holes is of a rectangular shape.
4. The semiconductor package of claim 2, wherein a bottom of each of the one or more through holes is of a rectangular shape with four filleted corners.
5. The semiconductor package of claim 1,
 wherein the one or more through holes are symmetric with respect to a centerline of a bottom surface of the semiconductor package.
6. The semiconductor package of claim 1 further comprising
 a first exposed die paddle portion; and
 a second exposed die paddle portion;
 wherein the first exposed die paddle portion and the second exposed die paddle portion are symmetric with respect to a centerline of a top surface of the semiconductor package; and
 wherein a width of each of the first exposed die paddle portion and the second exposed die paddle portion is in a range from seven percent to fifteen percent of a width of the top surface of the semiconductor package.

7. The semiconductor package of claim 6 further comprising one or more clips;
wherein the lead frame further comprises
a plurality of leads; and
wherein the one or more clips connect the chip to the plurality of leads.

8. The semiconductor package of claim 1 further comprising two or more clips completely separated from one another; wherein each of the two or more clips individually connects a first electrode on a top surface of the chip to a first lead of the lead frame.

9. The semiconductor package of claim 8 further comprising a gate clip connecting a gate electrode on the top surface of the chip to a gate lead of the lead frame separated from the first lead.

10. A semiconductor package comprising:
a lead frame comprising
a first die paddle; and
one or more leads disposed along a first side of the first die paddle;
a chip mounted on the first die paddle; and
a molding encapsulation enclosing the chip;
wherein the first die paddle comprises one or more through holes aligned in parallel and approximate to a second side of the first die paddle opposite the first side of the first die paddle; and
wherein an entirety of the one or more through holes is filled with a first portion of the molding encapsulation;
wherein the first die paddle further comprises
a first squeezed extension along an edge sidewall of the first die paddle at a third side orthogonal to the first and second sides, the first squeezed extension comprising an upper tapered side wall; and
a lower tapered side wall;
wherein a top surface of the first squeezed extension is positioned lower than a top surface of the first die paddle;
wherein a bottom surface of the first squeezed extension is positioned higher than a bottom surface of the first die paddle;
wherein the upper tapered side wall directly contacts the molding encapsulation; and
wherein the lower tapered side wall directly contacts the molding encapsulation.

11. The semiconductor package of claim 10, wherein the first die paddle further comprises
a second squeezed extension;
wherein the first squeezed extension and the second squeezed extension are symmetric with respect to a centerline of a bottom surface of the semiconductor package.

12. A semiconductor package comprising:
a lead frame comprising
a first die paddle; and
one or more leads disposed along a first side of the first die paddle;
a chip mounted on the first die paddle; and
a molding encapsulation enclosing the chip;
wherein the first die paddle comprises one or more through holes aligned in parallel and approximate to a second side of the first die paddle opposite the first side of the first die paddle;
wherein an entirety of the one or more through holes is filled with a first portion of the molding encapsulation;
wherein each of the one or more through holes comprises
an upper section;
a middle section; and
a lower section;
wherein a width of the upper section is smaller than a width of the lower section;
wherein a largest width of the middle section is smaller than the width of the upper section;
wherein the middle section comprises
a tapered sub-section; and
a straight sub-section below the tapered sub-section; and
wherein a width of a top of the tapered sub-section is smaller than a width of the straight sub-section.

* * * * *